United States Patent
Wessling

(10) Patent No.: US 8,153,271 B2
(45) Date of Patent: *Apr. 10, 2012

(54) ARTICLE WITH A COATING OF ELECTRICALLY CONDUCTIVE POLYMER AND PRECIOUS/SEMIPRECIOUS METAL AND PROCESS FOR PRODUCTION THEREOF

(75) Inventor: Bernhard Wessling, Bargteheide (DE)

(73) Assignee: Ormecon GmbH, Ammersbek (DE)

( * ) Notice: Subject to any disclaimer, the term of this patent is extended or adjusted under 35 U.S.C. 154(b) by 443 days.

This patent is subject to a terminal disclaimer.

(21) Appl. No.: 12/439,133

(22) PCT Filed: Aug. 24, 2007

(86) PCT No.: PCT/EP2007/007467
§ 371 (c)(1),
(2), (4) Date: May 28, 2009

(87) PCT Pub. No.: WO2008/031492
PCT Pub. Date: Mar. 20, 2008

(65) Prior Publication Data
US 2010/0012359 A1    Jan. 21, 2010

(30) Foreign Application Priority Data

Sep. 13, 2006 (DE) .......................... 10 2006 043 811
Oct. 5, 2006 (DE) .......................... 10 2006 047 501

(51) Int. Cl.
*B21B 39/00* (2006.01)
(52) U.S. Cl. ........ 428/621; 428/618; 428/624; 428/626; 428/668
(58) Field of Classification Search .................. 428/616, 428/646, 668, 618, 621, 624, 626
See application file for complete search history.

(56) References Cited

U.S. PATENT DOCUMENTS

| | | |
|---|---|---|
| 3,977,756 A | 8/1976 | Rodondi |
| 4,394,498 A | 7/1983 | Kastelic |
| 4,585,695 A | 4/1986 | Ogasawara et al. |
| 4,657,632 A | 4/1987 | Holtzman et al. |
| 4,929,388 A | 5/1990 | Wessling |
| 4,959,180 A | 9/1990 | Armes et al. |
| 5,104,599 A | 4/1992 | Prevorsek et al. |
| 5,173,766 A | 12/1992 | Long et al. |
| 5,192,835 A | 3/1993 | Bull et al. |
| 5,278,213 A | 1/1994 | Han et al. |
| 5,281,363 A | 1/1994 | Shacklette et al. |
| 5,403,913 A | 4/1995 | MacDiarmid et al. |
| 5,498,761 A | 3/1996 | Wessling et al. |
| 5,532,025 A | 7/1996 | Kinlen et al. |
| 5,567,355 A | 10/1996 | Wessling |
| 5,595,689 A | 1/1997 | Kulkarni et al. |
| 5,645,890 A | 7/1997 | MacDiarmid et al. |
| 5,720,903 A | 2/1998 | Wessling et al. |
| 5,846,606 A | 12/1998 | Wessling |
| 5,922,466 A | 7/1999 | Angelopoulos et al. |
| 6,015,482 A | 1/2000 | Stern |
| 6,015,613 A | 1/2000 | Kinlen et al. |
| 6,123,995 A | 9/2000 | Sonnenberg et al. |
| 6,194,087 B1 | 2/2001 | Huhn et al. |
| 6,361,823 B1 | 3/2002 | Bokisa et al. |
| 6,459,564 B1 | 10/2002 | Watanabe et al. |
| 6,592,020 B1 | 7/2003 | Currie et al. |
| 6,632,380 B1 | 10/2003 | Wessling |
| 6,773,568 B2 | 8/2004 | Egli et al. |
| 6,784,530 B2 | 8/2004 | Sugaya et al. |
| 6,821,323 B1 | 11/2004 | Bell et al. |
| 6,824,857 B2 * | 11/2004 | Lochun et al. ................. 428/209 |
| 6,962,642 B2 | 11/2005 | Knadle et al. |
| 7,018,866 B2 | 3/2006 | Sugaya et al. |
| 7,087,441 B2 | 8/2006 | Konrad et al. |
| 7,105,221 B2 | 9/2006 | Akamatsu et al. |
| 7,396,596 B2 | 7/2008 | Wessling |
| 7,547,479 B2 | 6/2009 | Wessling |
| 7,683,124 B2 | 3/2010 | Wessling |
| 7,947,199 B2 * | 5/2011 | Wessling ...................... 252/500 |
| 7,989,533 B2 * | 8/2011 | Wessling ...................... 524/434 |
| 2002/0110701 A1 | 8/2002 | Wehrmann et al. |
| 2002/0187364 A1 | 12/2002 | Heber et al. |
| 2003/0075270 A1 | 4/2003 | Landi et al. |
| 2004/0021131 A1 | 2/2004 | Blanchet-Fincher et al. |
| 2004/0191605 A1 | 9/2004 | Kinkelaar et al. |
| 2005/0209117 A1 | 9/2005 | Friedrich et al. |
| 2007/0142595 A1 | 6/2007 | Hashiba et al. |
| 2007/0275159 A1 | 11/2007 | Wessling |
| 2008/0032109 A1 | 2/2008 | Leising et al. |
| 2008/0265215 A1 | 10/2008 | Wessling |
| 2009/0154059 A1 | 6/2009 | Wessling et al. |
| 2010/0133478 A1 | 6/2010 | Wessling |
| 2010/0193573 A1 | 8/2010 | Wessling |

FOREIGN PATENT DOCUMENTS

CA    2000431    10/1989

(Continued)

OTHER PUBLICATIONS

Office Action issued Feb. 18, 2011 in U.S. Appl. No. 12/761,183.

(Continued)

*Primary Examiner* — Cathy Lam
(74) *Attorney, Agent, or Firm* — Swanson & Bratschun, L.L.C.

(57) ABSTRACT

The invention relates to a coated article which has (i) at least one electrically non-conducting base layer, (ii) at least one layer of copper and/or a copper alloy, and (iii) a layer which contains at least one electrically conductive polymer, wherein the copper or copper alloy layer (ii) is positioned between the base layer (i) and the layer containing the conductive polymer (iii), and which is characterized in that the layer (iii) contains at least one precious metal or at least one semiprecious metal or a mixture thereof. The invention also relates to a process for its production and also its use for the prevention of corrosion and to preserve the solderability of printed circuit boards.

23 Claims, 16 Drawing Sheets

FOREIGN PATENT DOCUMENTS

| | | |
|---|---|---|
| CA | 2553467 | 8/2005 |
| DE | 37 29 566 | 3/1989 |
| DE | 42 38 765 | 5/1994 |
| DE | 43 17 010 A1 | 11/1994 |
| DE | 43 33 127 A1 | 3/1995 |
| DE | 195 25 708 C1 | 1/1997 |
| DE | 198 12 258 A1 | 9/1999 |
| DE | 695 23 755 T2 | 8/2002 |
| DE | 698 07 230 T2 | 4/2003 |
| DE | 102 34 363 | 2/2004 |
| DE | 699 13 605 T2 | 9/2004 |
| DE | 699 13 247 T2 | 10/2004 |
| DE | 10 2004 003 784 | 8/2005 |
| DE | 20 2005 010364 | 9/2005 |
| DE | 10 2004 030 388 | 1/2006 |
| DE | 10 2004 030 930 | 2/2006 |
| DE | 10 2007 040 065.0 | 8/2007 |
| EP | 0 407 492 B1 | 1/1991 |
| EP | 0 466 943 | 9/1991 |
| EP | 0 700 573 B1 | 3/1996 |
| EP | 0 329 768 | 11/1996 |
| EP | 0 807 190 B1 | 11/1997 |
| EP | 0 656 958 B1 | 4/1999 |
| EP | 1 061 530 | 5/2000 |
| EP | 0 767 974 | 11/2001 |
| EP | 0 993 512 | 8/2002 |
| EP | 0 962 486 | 12/2003 |
| EP | 0 962 943 | 12/2003 |
| EP | 1 391 536 A2 | 2/2004 |
| EP | 1 477 587 | 11/2004 |
| EP | 1 595 908 | 11/2005 |
| GB | 2 126 250 | 3/1984 |
| JP | 2002/289653 | 10/2002 |
| JP | 2003/129278 | 5/2003 |
| JP | 2003/277417 | 10/2003 |
| JP | 2003/332391 | 11/2003 |
| WO | WO 89/02155 | 3/1989 |
| WO | WO 94/27297 | 11/1994 |
| WO | WO 95/00678 | 1/1995 |
| WO | WO 95/09255 | 4/1995 |
| WO | WO 97/20084 | 6/1997 |
| WO | WO 99/05687 | 2/1999 |
| WO | WO 02/074534 | 9/2002 |
| WO | WO 2004/001099 | 12/2003 |
| WO | WO 2004/016698 | 2/2004 |
| WO | WO 2004/029128 | 4/2004 |
| WO | WO 2004/029133 | 4/2004 |
| WO | WO 2004/029176 | 4/2004 |
| WO | WO 2004/083283 | 9/2004 |
| WO | WO 2004/103040 | 11/2004 |
| WO | WO 2005/070972 | 8/2005 |

OTHER PUBLICATIONS

Technical Data Sheet 3M DOVID (Transparent Holographic) Security Laminate for Cards and Passports; May 2008.
Adams et al. (1998) J. Phys. Condens. Matter 10:8293-8303, "A new acid-processing route to polyaniline films which exhibit metallic conductivity and electrical transport strongly dependent upon intrachain molecular dynamics".
Adams et al. (1999) Synthetic Metals 101:685-685, Paper No. 6074, "Temperature dependent conductivity behaviour of polyaniline fibres".
Aldissi et al. (1998) Conference Proceedings at ANTEC '98, 2:1197-1201, "Conducting Polymers in Ultracapacitor Applications".
Arbizzani et al. (1996) Electrochimica Acta 41(1):21-26, "Polymer-Based Redox Supercapacitors: A Comparative Study".
Arici et al. (Mar. 2004), Thin Solid Films, 451-452:612-618, "Hybrid solar cells based on inorganic nanoclusters and conjugated polymers".
Armes et al. (1987) Journal of the Chemical Society, Chemical Communications, 288-290,"Dispersions of electrically Conducting Polypyrrole particles in aqueous media".
Brusic et al. (1997) J. Electrochem. Soc., 144:436-442, "Use of Polyaniline and Its Derivatives in Corrosion Protection of Copper and Silver".
Chen et al. (2003) Journal of Power Sources 117:273-282, "Electrochemical and capacitive properties of polyaniline-implanted porous carbon electrode for supercapacitors".
Du et al. (Mar. 1996) Presentation at the Meeting of the American Physical Society, Section M23, Presentation M 23 9 "Nonmetal-Metal Transition in Conducting Polyaniline Coated Carbon Blacks," Bulletin of the American Chemical Society, 41(1):557 (Abstract).
Dufour et al. (2003) Synthetic Metals 135-136:63-68, "The role of chain and dopant engineering in the preparation of processible conducting polymers with desired properties".
Gabrielson, L. and Folkes, J. (Jan. 2001) J. of Materials Science, 36(1):1-6, "Manufacture of colloidal polymer ellipsoids for anisotropic conducting nano-composites".
Gospodinova N et al. (Feb. 1997), Polymer, 38(3):743-746, "A new route to polyaniline composites".
Holland et al. (1996) J. Phys. Condens. Matter 8:2991-3002, "Conductivity studies of polyaniline doped with CSA".
Keville et al. (Jun. 1991) Journal of Colloid and Interface Science, 144(1):103-126, "Preparation and Characterization of Monodisperse Polymer Microspheroids".
Kiebooms et al. (2001) Handbook of Advanced Electronic and Photonic Materials and Devices, 8:1-102, "Synthesis, Electrical, and Optical Properties of Conjugated Polymers".
Kim et al. (May 2002), Macromolecules, 35:5314-5316, "Size Control of Polyaniline Nanoparticle by Polymer Surfactant".
Kosina et al. (1994) Journal of Materials Science, 29:3403-3407, "Study on the electrical conductivity and morphology of porous polypyrrole layers prepared electrochemically in the presence of pyridinium chlorochromate".
Laforgue et al. (2001) Journal of The Electrochemical Society 148(10):A1130-A1134, "Hybrid Supercapacitors Based on Activated Carbons and Conducting Polymers".
Lin et al. (2003) Carbon 41:2865-2871, "A novel method for carbon modification with minute polyaniline deposition to enhance the capacitance of porous carbon electrodes".
MacDiarmid et al. (Aug. 1994) Synthetic Metals 65(2-3): 103-116, "The concept of secondary doping as applied to polyaniline".
Mattes et al. (1997) Synthetic Metals 84:45-49, "Formation of conductive polyaniline fibers derived from highly concentrated emeraldine base solution".
Naarmann et al. (1987) Synthetic Metals 22:1-8, "New Process for the Production of Metal-Like, Stable Polyacetylene".
Novak et al. Chemical Rev. (1997), vol. 97, pp. 207-281, "Electrochemically active polymers for rechargeable batteries".
Office Action dated Feb. 13, 2009 for related U.S. Appl. No. 11/817,539.
Office Action dated Jun. 29, 2009 for related U.S. Appl. No. 10/597,170.
Office Action dated Jul. 26, 2006 for related U.S. Appl. No. 11/165,411.
Office Action dated Feb. 28, 2007 for related U.S. Appl. No. 11/165,411.
Office Action dated May 8, 2007 for related U.S. Appl. No. 11/165,411.
Office Action dated Jan. 23, 2008 for related U.S. Appl. No. 11/165,411.
Office Action dated Apr. 29, 2009 for related U.S. Appl. No. 11/757,190.
Office Action dated Nov. 4, 2009 for related U.S. Appl. No. 11/757,190.
Office Action dated Apr. 26, 2010 for related U.S. Appl. No. 11/757,190.
Office Action dated Oct. 7, 2009 for related U.S. Appl. No. 10/597,170.
Office Action dated Aug. 26, 2009 for related U.S. Appl. No. 11/817,539.
Office Action dated Nov. 9, 2009 for related U.S. Appl. No. 11/817,539.
Office Action dated May 17, 2010 for related U.S. Appl. No. 11/817,539.
Office Action dated May 26, 2010 for related U.S. Appl. No. 10/598,458.

Park et al. (2002) Journal of Power Sources 111:185-190, "Hybrid electrochemical capacitors based on polyaniline and activated carbon electrodes".

Parquet and Boggs (1995), Electronic Packaging & Productions, 9:38-42.

Pomfret et al. (2000) Polymer 41:2265-2269, "Electrical and mechanical properties of polyaniline fibres produced by a one-step wet spinning process".

Posdorfer and Wesseling (2000) Ormecon GmbH, Ammersbek, Oxidation of copper in the presence of organic metal polyaniline.

Rudge (1994) Journal of Power Sources 47:89-107, "Conducting polymers as active materials in electrochemical capacitors".

Ryden et al. (Jan. 1968) Physics Letters 26A(5):209-210, Temperature Dependence of the Resistivity of RuO2 and IrO2.

Sarangapani et al. (1990) Journal of Power Sources 29:355-264, "Advanced Double Layer Capacitors".

Talbi et al. (2003) Journal of Applied Electrochemistry 33:465-473, "Electropolymerization of aniline on carbonized polyacrylonitrile aerogel electrodes: applications for supercapacitors".

Zhou et al. (2001) J. Matr. Sci. 36(13):3089-3095, "Electrically conductive PANi multifilaments spun by a wet-spinning process".

International Preliminary Report on Patentability issued Dec. 3, 2008 in PCT Application Serial No. PCT/EP2007/007467.

Written Opinion in PCT Application Serial No. PCT/EP2007/007467.

Office Action dated Oct. 4, 2010 for related U.S. Appl. No. 12/063,642.

Office Action dated Oct. 5, 2010 for related U.S. Appl. No. 11/817,539.

"Alternative Technologies for Surface Finishing—Cleaner Technology for Printed Wired Board Manufacturers", EPA, Office of Pollution Prevention and Toxics (Jun. 2001) EPA 744-R-01-001.

Harrison et al. (1992) Surface and Interface Analysis, 18:368-376, "The Determination of Uncertainties in Quantitative XSP/AES and its Impact on Data Acquisition Strategy".

Scofield (1976) Journal of Electron Spectroscopy and Related Phenomena, 8:129-137, "Hartree-slater Subshell Photoionization Cross-sections at 1254 and 1487 eV".

Stratmann et al. (1991) Corrosion Science, 32:467-470, "A New Technique Able to Measure Directly the Delamination of Organic Polymer Films".

Stratmann et al. (1991) Ber. Bunsenges. Phys. Chem., 95:1365-1375, "Use of a Scanning-Kelvinprobe in the Investigation of Electrochemical Reactions at the Metal/Polymer Interface".

Wessling et al (2000) European Physical Journal E, 2:207-210, "Dispersion-induced insulator-to-metal transistion in polyaniline".

Office Action issued Jan. 10, 2011 in U.S. Appl. No. 12/063,642.

"Electric Double Layer Capacitors and Electric Power Storage Systems" The Nikkan Kogyo Simbun, Ltd. (English translation of relevant portion).

ORMECON CSN process, Chemisch Zinn, Ormecon GmbH, Ammersbek, 2003.

ORMECON CSN process, Ormecon GmbH, Ammersbek, 2003.

* cited by examiner

ARTICLE WITH A COATING OF ELECTRICALLY CONDUCTIVE POLYMER AND PRECIOUS/SEMIPRECIOUS METAL AND PROCESS FOR PRODUCTION THEREOF

RELATED APPLICATIONS

This application is a 35 U.S.C. §371 national phase application of PCT/EP2007/007467 (WO 2008/031492), filed on Aug. 24, 2007, entitled "Article with a Coating of Electrically Conductive Polymer and Precious/Semiprecious Metal and Process for Production Thereof," which application claims priority to German Application Serial No. 10 2006 043 811.6, filed Sep. 13, 2006 and German Application Serial No. 10 2006 047 501.1, filed Oct. 5, 2006, each of which is specifically incorporated herein by reference in its entirety.

The present invention relates to coated articles which contain a layer of copper or a copper alloy and a layer with a combination of intrinsically electrically conductive polymer and precious metal and/or semiprecious metal, and which are particularly suitable as printed circuit boards or for the production of printed circuit boards.

Copper is one of the most widely used metallic materials of our time. Although copper is a semiprecious metal, this material is readily oxidizable, which often has an adverse effect on its use properties. This manifests itself not only visually but also has in particular practical technical disadvantages. Particular problems arise in the coating of printed circuit boards, which are then assembled in soldering processes, copper wires which are used as electrical conductors, or copper pipes. Finely divided copper powders are practically impossible to produce and use without oxidation protection.

Copper is normally not, like iron and steel, provided with protective coatings which in the case of lacquers often have to be applied in several layers. Instead, as protection against copper corrosion, substances which form complexes with copper, such as for example imidazoles, benzimidazoles, benzotriazoles, and imidazole-2-thione, are predominantly used.

Such organic complexing agents are admittedly inexpensive and easy to process, however they display a number of disadvantages. Thus formulations with imidazoles or benzimidazoles often contain formic acid and sometimes other organic acids which smell unpleasant, are corrosive and have toxicological disadvantages. In addition, the thermal stability is low.

Therefore, in the production of printed circuit boards, for protection against corrosion copper is often coated with other metals such as for example gold, silver or tin, in order to preserve the solderability of the copper contacts and the copper-plated drill holes, which is otherwise lost in a very short time through oxidation.

An overview of common solderable final surfaces and their technical, economic, ecological and toxicological advantages and disadvantages is to be found in "Alternative Technologies for Surface Finishing—Cleaner Technology for Printed Wired Board Manufacturers", EPA, Office of Pollution Prevention and Toxics, June 2001, EPA 744-R-01-001.

Metallic coatings are in general very suitable for printed circuit boards, however they also display a number of disadvantages. Coatings with gold are expensive not only on account of the high gold price, but in addition require special processes for the application of the gold layer. For example, gold cannot be chemically applied in so-called horizontal plants but only in vertical plants, which results in additional high process costs. A further technical risk is the so-called "black pad" phenomenom, which is a corrosion phenomenom. Furthermore, soldered joints with a nickel-gold surface are not totally reliable because of the formation of a nickel-phosphor or phosphor phase which weakens the soldered joint.

The application of silver is poorly reproducible, and the necessary plants are difficult to regulate. In addition, silver-plated copper pads often tarnish e.g. due to sulphur compounds contained in the air. In addition, the mechanical strength and electric reliability of soldered joints on silver-plated copper pads is often greatly impaired by so-called "microvoids" which appear at the boundary surface (interface).

A disadvantage common to all metallic coatings is that the deposition of the metallic coat requires a lot of time, which causes considerable apparatus and processing costs. On the other hand, organic coats are applied in a very much shorter time.

Tin is admittedly satisfactory from the technical and economic point of view in particular when it is applied with the aid of an organic metal, such as for example in the ORMECON CSN-process of Ormecon GmbH, Ammersbek, Germany. However its deposition as a rule requires several minutes (e.g. between 15 and 25 minutes), which renders correspondingly large-sized plants necessary in order to ensure a high throughput.

A process is known from German patent application DE 10 2004 030 388 ("OMN") with which the copper surfaces ("pads") to be soldered are coated with dispersions which contain substantially intrinsically conductive polymers which equally protect against oxidation and preserve solderability.

This process is superior to conventional, purely organic coatings, so-called "OSPs" (=Organic Solderability Preservatives) in their resistance to aging, but still has some disadvantages. One of the disadvantages is that the coating is not visually detectable due to its thin layer thickness (less than 100 nm), which makes an initial quality check difficult. Moreover, its resistance to aging—although clearly improved compared with conventional OSPs—is still much less than that of metallic coatings.

From EP 0 807 190 B1, a process for the production of metallized materials is known in which the material to be metallized is first coated with an intrinsically conductive polymer, the intrinsically conductive polymer is then activated by reduction and finally the metal is applied in a non-electrochemical manner, wherein the coated material is brought into contact with a solution of ions of the metal. The process is particularly suitable for the deposition of tin onto copper but also for the metallization of plastic surfaces.

The object of the invention is thus to provide an organic coating which has almost all of the properties of metallic coatings on copper, or provide a metallic coating which can be applied as quickly and easily as organic coatings, without losing too many properties in the process. Also, the coating of the invention should be capable of being prepared with very good reproducibility, and should not show the disadvantages associated with the prior art processes discussed above.

The above-defined object is achieved according to the invention in that a coating is applied to copper which contains one or more intrinsically conductive polymers or organic (nano-) metal(s) precious metal(s) and/or semiprecious metal(s).

Specifically, according to a first aspect of the invention, the object is achieved through a coated article which comprises
 (i) at least one electrically non-conducting base layer,
 (ii) at least one layer of copper and/or a copper alloy, and (iii) a layer which contains at least one electrically conductive polymer and at least one precious metal and/or semiprecious metal.

The article is characterized in that the copper or copper alloy layer (ii) is positioned between the base layer (i) and layer (iii) containing the conductive polymer.

Furthermore, according to a second aspect of the invention, the object is achieved through a coated article which comprises (i) at least one electrically non-conducting base layer,
(ii) at least one layer of copper and/or a copper alloy, and
(iii) a nanoscopic layer having a thickness of 100 nm or less, which layer contains at least 80 weight-%, relative to layer (iii), of at least one precious metal and/or semiprecious metal different from copper.

Further embodiments of the present invention are disclosed in the independent and dependent claims attached to this description.

Layers according to the invention can be prepared using a number of methods which are in common use in the field of nanotechnology. Particularly preferred are methods wherein the (semi)precious metal is dissolved in a dispersion of an intrinsically conducting polymer or organic nanometal and wherein the metal is deposited from this dispersion/solution.

In the following description, unless specifically noted, the disclosure on the details of the present invention relates to both the first and second aspect of the invention.

The solution according to the invention is surprising in as much as it was not to be expected in the light of the state of the art that a nanoscopic layer which contains a precious metal and/or semiprecious metal and an electrically conductive polymer could be produced and displays properties which combine the positive properties of the organic layers and those of the precious metals, despite the layers being thinner by more than one order of magnitude than conventional metallic end layers for preserving solderability.

The thickness of layer (iii) according to the first aspect of the invention is preferably less than 1 μm, which contradicts the general expectation, according to which a larger effect would be achieved with thicker layers. The thickness of layer (iii) is preferably at least ca. 10 nm. Particularly preferred are layer thicknesses of less than 500 nm such as 200 to 400 nm or 200 to 350 nm, e.g. about 300 nm, e.g. less than 200 nm. These values relate to the complete thickness of the layer, i.e. metallic and organic components. A method suitable to determine the layer thickness is an electrochemical determination (galvanostatic coulometric measurement for example) and/or determination by XPS.

The (average) thickness of layer (iii) according to the second aspect of the invention is 100 nm or less in total and less than 10 nm insofar as the metal constituent is concerned. It can be determined by using methods well known in the art, for example electrochemically or by means of EDX (Energy Dispersive X-Ray Analysis). Preferably, there are no other materials between the layers (i), (ii) and (iii).

The layer does not necessarily need to be homogeneous, it can be a more or less homogeneously thin layer or can be composed of individual particles with a somewhat bigger diameter, and their average thickness meeting the above mentioned criteria.

The fact that the average thickness of layer (iii) as defined above according to the second aspect of the invention is 100 nm or less, is contrary to the general expectation that layers of higher thickness would show a larger or stronger effect.

According to the second aspect of the invention, the layer contains at least 80% by weight of precious or semiprecious metal. However, it is not necessarily homogeneous, of uniform thickness or uniform density. The (semi)precious metal can also be deposited in the form of nanoscopic spheres of 50 to 150 nm diameter. Those spheres are distributed regularly (from a statistical point of view) on the copper surface. However, preferably they are deposited along edges or grain boundaries. Sometimes and in particular when the density of the nanoscopic spheres increases, they may form lengthy chains. In order to achieve good results, it may be sufficient that only about 10% of the surface are coated with the (semi)precious metal. The resulting effective thickness of the layer is therefore, in the average, only a few nanometers, typically about 5 nm. It can be measured by using XPS.

The values given herein with regard to thickness and composition of layer (iii) according to both aspects of the invention relate to the values defined as hereinabove and measured as described hereinabove.

According to both the first and second aspect of the present invention, layer (iii) contains at least one electrically conductive polymer and, optionally, organic copper complexing agents, in particular nitrogen containing or other organic compounds capabable of forming complexes with copper in organic or aqueous solvents. In particular, the copper complexing agent is selected from the group of nitrogen containing heterocyclic compounds or urea derivatives. Preferred examples are imidazoles, benzimidazoles, benzotriazoles, imidazole-2-thione, thiourea, urea, (sodium) ethylenediaminetetraacetate (EDTA), (K, Na-)tartrates, ethylenediamine disuccinic acid.

The conductive polymer is preferably used in the form of an organic metal. Combinations of different substances from this substance class can be used. In the context of this invention, if not otherwise stated, polymers are understood to mean organic polymers.

Electrically conductive polymers or conductive polymers, which are also described as "intrinsically conductive polymers", are understood to mean substances which are built up of small molecule compounds (monomers), are at least oligomeric by polymerization, and thus contain at least 3 monomer units which are linked by chemical bonding, display a conjugated π-electron system in the neutral (non-conductive) state and can be converted by oxidation, reduction or protonation (which is often described as "doping") into an ionic form which is conductive. The conductivity is at least $10^{-7}$ S/cm and is normally less than $10^5$ S/cm. These polymers are referred to herein also simply as "conductive" or "electrically conductive polymers".

As doping agents, for example iodine, peroxides, and Lewis are used in the case of doping by oxidation, or for example sodium, potassium, calcium in the case of doping by reduction. Protic acids such as para-toluene sulfonic acid or polystyrenesulfonic acids or the like may be used for doping by protonation.

Conductive polymers can be chemically exceptionally diverse in composition. As monomers, for example acetylene, benzene, naphthalene, pyrrole, aniline, thiophene, phenylene sulphide, peri-naphthalene and others, and derivatives thereof, such as sulpho-aniline, ethylenedioxythiophene, thieno-thiophene and others, and alkyl or alkoxy derivatives thereof or derivatives with other side-groups, such as sulphonate, phenyl and other side-groups, have proved useful. Combinations of the aforesaid monomers can also be used as monomers. For this, for example aniline and phenylene sulphide are linked, and these A-B dimers then used as monomers. Depending on the objective, for example pyrrole, thiophene or alkylthiophenes, ethylenedioxythiophene, thieno-thiophene, aniline, phenylene sulphide and others can be bound together into A-B structures and these then converted into oligomers or polymers.

Most conductive polymers display a more or less strong rise in conductivity with increasing temperature, which identifies them as non-metallic conductors. Other conductive polymers display a metallic behaviour at least in a temperature range close to room temperature in that their conductivity decreases with increasing temperature. A further method of recognizing metallic behaviour consists in the plotting of the so-called "reduced activation energy" of the conductivity against the temperature at low temperatures (down to near 0 K). Conductors with a metallic contribution to the conductivity display a positive gradient of the curve at low temperature. Such substances are described as "organic metals".

Organic metals are known per se. According to Wessling et al., Eur. Phys. J. E 2, 2000, 207-210, the transition from the state of a non-metallic to an at least partially metallic conductor can be effected by a single-step frictional or dispersion procedure after completion of the synthesis of the intrinsically conductive polymer, the process technology basis whereof is described in EP 0 700 573 A. In this way, through the dispersion procedure the conductivity is also increased, without the chemical composition of the conductive polymer used being significantly altered.

Preferred intrinsically conductive polymers are those mentioned above. In particular, the following can be mentioned as examples: polyaniline (PAni), polythiophene (PTh), poly(3, 4-ethylenedioxy-thiphens) (PEDT), polydiacetylene, poly-acetylene (PAc), poly-pyrrole (PPy), polyisothianaphthene (PITN), polyheteroarylene-vinylene (PArV), wherein the heteroarylene group can for example be thiophene, furan or pyrrole, poly-p-phenylene (PpP), polyphenylene sulphide (PPS), polyperinaphthalene (PPN), polyphthalocyanine (PPc) inter alia, and derivatives thereof (which are for example formed with monomers substituted with side-chains or -groups), copolymers thereof and physical mixtures thereof. Particularly preferred are polyaniline (PAni), poly-thiophene (PTh), polypyrrole (PPy), poly(3,4-ethylenediox-ythiophene) (PEDT), polythieno-thiophene (PTT) and derivatives thereof and mixtures thereof. Most preferred is polyaniline.

Layer (iii) contains at least one precious metal which is selected in particular from the group Ag, Au, Pt, Pd, Rh, Ir, Ru, Os and Re, and/or a semiprecious metal which is selected from Ni, Ti, Cu, Sn and Bi. Layer (iii) furthermore contains one or more intrinsically electrically conductive polymers or organic (nano-) metals or mixtures thereof, optionally together with other substances such as non-electrically conductive components, and/or copper complexing agents.

According to a preferred embodiment, layer (iii) contains polymer blends, that is mixtures of conductive polymer/organic metal (or a combination of several) with electrically non-conductive polymers. Particularly suitable as non-conductive polymers are water-soluble or water-dispersible polymers, in particular polystyrene-sulphonic acid, polyacrylates, polyvinyl butyrates, polyvinyl-pyrrolidones, polyvinyl alcohols and mixtures thereof. Conductive and non-conductive polymers are preferably used in the ratio of 1:1.5 to 1:20.

Layer (iii) can also contain further compounds like copper complexing agents and other additives, in particular viscosity modifiers, flow aids, drying aids, gloss improvers, flatting agents and mixtures thereof, preferably in a concentration of 0.01 to 40 wt %, preferably 0.10 to 5 wt. % additive relative to the mass of layer (iii).

The other copper complexing agents can be for example imidazoles, benzimidazoles, benzotriazoles, imidazole-2-thione, thiourea and urea and comparable materials.

According to the first aspect of the invention, layer (iii) preferably contains 15 to 40% conductive polymer and other copper complexing agents, and 15 to 40% precious metal(s) or semiprecious metal(s), relative to the mass of layer (iii).

According to the second aspect of the invention, layer (iii) preferably contains more than 80% precious metal or semi-precious metal, in particular more than 80% to e.g. 90% or 95%, based on the mass of layer (i).

It has been found that a combination of the conductive polymer(s)/organic metal(s) with complexing agents such as those which are capable of complexing copper can be advantageous. Preferred complexing agents are imidazoles, benz-imidazoles or comparable complexing agents, such as benzotriazoles, urea, thiourea, imidazole-2-thione, (Natrium) Ethylendiamin-tetraacetat (EDTA), (Ka-, Na-)Tartrates, Ethylendiamin-dibernsteinsäure, and mixtures thereof, which are characterized by a relatively good thermal stability.

As base layer (i), all materials used in printed circuit board technology are suitable, in particular epoxides and epoxide composites, Teflon, cyanate esters, ceramics, cellulose, and cellulose composites, such as for example cardboard, materials based on these substances and flexible base layers, for example based on polyimide. The base layer preferably has a layer thickness of 0.1 to 3 mm.

The copper layer or copper alloy layer (ii) preferably has a thickness of 5 to 210 µm, in particular 15 to 35 µm.

Between layer (ii) and layer (iii), a further metal or alloy layer (iv) can be positioned. Layer (iv) preferably contains silver, tin, gold, palladium or platinum. According to a preferred embodiment, layer (iv) mainly contains, i.e. more than 50 wt. % relative to the mass of layer (iv), one or several of the said metals. The said metals can in particular be present as an alloy with copper. According to another preferred embodiment, layer (iv) consists exclusively of the said metals, either in pure form or in the form of an alloy. Layer (iv) preferably has a layer thickness of 10 to 800 nm. As well as the metal or the alloy, layer (iv) can contain organic components, in a concentration of preferably 1 to 80 wt. % relative to the total.mass of layer (iv) (metal content 20 to 99 wt. %). Preferred organic components are conductive polymers or organic metals, or organic copper complexing agents such as thiourea or benzotriazoles.

The articles according to the invention are particularly suitable for the production of printed circuit boards, and the articles are preferably printed circuit boards which are also described as boards. These are thin plates used for the assembly of electrical components, with holes through which the leads of components are inserted for further soldering.

For the production of the coated articles according to the invention and in particular of printed circuit boards
(1) a layer of copper or a copper-containing alloy is applied onto the surface of a base layer;
(2) the layer produced in step (1) is structured; and
(3) a layer which contains at least one electrically conductive polymer or organic (nano-)metal and at least one precious metal or semiprecious metal is applied onto the structured copper or copper alloy layer.

In the following description of the process of the invention, unless specifically noted, the disclosure relates to articles comprising a coating as defined with regard to both the first and second aspect of the invention as defined hereinabove.

According to a preferred embodiment of the process, the copper or copper alloy layer (ii) is degreased and cleaned following step (1). For this the articles are preferably treated with normal commercial acidic cleaners. Cleaners based on sulphuric acid and citric acid, such as for example the cleaner ACL 7001 from Ormecon GmbH, are preferred. The articles are preferably left in the cleaning bath for about 2 minutes at 45° C. and then washed with water.

In addition, it is preferable to pre-treat the copper or copper alloy layer (ii) oxidatively following step (1) or after the cleaning, for example by etching the surface with $H_2O_2$ or inorganic peroxides. Suitable etching solutions are commercially available, for example the hydrogen peroxide-containing solution Etch 7000 from Ormecon GmbH or other peroxides. The articles are preferably left in the etching solution for about 2 minutes at 30° C.

The layer produced in step (1) is preferably structured by lithographic or etching processes, whereby the conductor track structure is created.

The implementation of the individual steps of the above process is known per se to the skilled person. Preferably layer (iii) is applied to the article by treating this, after rinsing with water, with a dispersion of the conductive polymer(s) or organic metal(s) in a dispersion agent which is liquid at room temperature, for example by immersion of the article in the dispersion or by application thereof onto the article.

The electrically conductive polymer or polymers are preferably contained in the dispersion medium in colloidal form.

The precious metal or precious metals or semiprecious metals are contained as water-soluble ions in the dispersion medium.

According to the first aspect of the invention, to deposit a layer based on an intrinsically conductive polymer and e.g. silver, a dispersion having a concentration of up to 150 mg/l Ag ions (e.g. in form of $AgNO_3$, but any other Ag salt may be taken as well) may be used, and the coating takes place at room temperature (about 20° C.) for 60 to 120 sec. Preferably, the article is contacted with the dispersion for 30 seconds to 5 minutes at room temperature.

According to the second aspect of the invention, it has been found that starting from a concentration of 150 mg/l of e.g. $AgNO_3$ or another precious or semiprecious metal according to the invention and when using coating times of more than 60 sec., preferably at least 90 sec., and at temperatures above room temperature, e.g. above 25° C., preferably above 30° C., the organic proportion of the layer decreases to below about 20%. Thus, the one or more precious metal or semiprecious metal are present in the dispersion medium as water-soluble ions in a concentration of $\geq 150$ mg/l, e.g. in particular in a concentration of 180 mg/l, such as, for example, 200 mg/l or in a range of more than 150 mg/l to 250 mg/l, e.g. up to about 500 mg/l or to 1000 mg/l. Also, concentrations up to several g/l may be used, for example, up to 10 g/l. Preferably, the article is contacted with the dispersion at $\geq 25°$ C. for more than 60 sec. up to 5 min., e.g. for 90 to 100 sec. Preferably, the contacting is done at a temperature of 35° C. to 45° C. for 90 to 120 sec.

Thus, the nanoscopic layers according to the second aspect can be prepared by a comparatively small change in the coating process parameters as compared to those of the first aspect of the present invention.

Furthermore, it is noted that this does not significantly change the further properties of the coating. Rather to the contrary, the layer according to the second aspect of the invention may be even more stable against a number of aging effects. For example, the wetting angles are even better and even after 10 reflow steps are below 50°.

Furthermore, the nanoscopic layers according to the second aspect of the invention are particularly stable when being stored under moist conditions (at 85° C./85% relative moisture for 8 to 24 hrs).

The layers formed according to this invention may appear in form of more or less homogeneous thin layers (which do not show specific features in SEM due to their nanoscopic size)—see FIG. 3a—with only a small number of distinct particles of small size, or can occur in form of layers mainly consisting of distinct particles (see the SEM image in FIG. 3c)

FIG. 3b shows an example of a coating according to the second aspect of the invention. Also here, no special features can be seen on the surface (apart from the copper crystal structure underneath the thin layer deposit).

Additional components, such as electrically non-conductive polymers and additives, can be dissolved in the dispersion medium or also be present therein in colloidal form. As dispersion media, organic solvents, preferably organic solvents miscible with water, water and mixtures thereof are suitable. Preferred solvents miscible with water are alcohols, in particular alcohols with a boiling point of more than 100° C. and preferably below 250° C. After the application of the dispersion onto the article, this is gently dried and if necessary further dispersion is applied, until the desired layer thickness is attained. The production and use of dispersions suitable for coating is known from the state of the art, see for example EP 0 407 492 B1.

Water and aqueous solvents are preferred as the dispersion medium. These are advantageous not only with regard to emissions and the non-wetting of the solder stop lacquer; it has also been found that water and aqueous solvents yield better results. This was surprising in that oxidation processes on copper proceed particularly rapidly in an aqueous environment. Solder stop lacquer is used to mask the areas of the printed circuit board which must not be wetted by the solder during the assembly process. The solder stop lacquer should not be wetted by the conductive polymer, since otherwise this would cause short circuits between the copper surfaces.

Preferably dispersions which contain no formic acid or acetic acid are used, however, other acids and/or buffers can be contained in the dispersions.

Surprisingly it was shown that certain dispersions produced commercially by Ormecon GmbH are suitable for reaction with precious or semiprecious metal ions and for reformulation into dispersions which can deposit homogeneous layers in the shortest possible time. The dispersions D 1021, D 1022, OMP 7000 and OMN 7100 or 7200 from Ormecon GmbH are particularly suitable as starting dispersions. OMN 7100 and D 1022 are preferred. Both are aqueous dispersions with approximately 0.5% organic metal.

The doping agent is not critical. Para-toluene sulfonic acid, methane sulfonic acid or polystyrene sulfonic acid are preferred. Mixtures thereof may also be used.

In another embodiment, the dispersions of the conductive polymer(s) or organic metals and the solutions of the precious/semiprecious metal(s) can be used separately in succession, wherein the conductive polymer dispersion serves as a pre-treatment and the precious/semiprecious metal is then deposited on the Cu surface pre-treated with the conductive polymer/organic metal.

The coated articles according to the invention are characterized in particular in that they can not only be soldered well even after prolonged storage, but are also solderable several times, i.e. can be used in multistage soldering processes, so-called reflow processes. In this respect, the properties of (much thicker) metallic coatings were reached or exceeded.

In aging tests, the new coating, in particular that of the second aspect, is superior to all other known surface finishings. During the aging process, the colour does hardly change. (The original colour is a mat silver-grey with copper-colour shining through, however, the copper red being significantly reduced). It merely becomes a bit darker. In reflow tests, even after 10 reflow steps, there was no decrease in the solderability.

In contrast to silver-finished surfaces and electroless nickel/gold, but also in contrast to conventional (OSP) surfaces, there are no microvoids.

In contrast to conventional silver surfaces, there is no tarnish and no reduction in the solderability during storage under normal air atmosphere. (Printed circuit boards having a silver surface finish normally have to be sealed shortly after their manufacture to protect them against tarnish and loss of conductivity.)

Furthermore, compared to other (prior art) coating procedures suitable for depositing e.g. 5 or 10 nm silver layers or procedures suitable for depositing spheres of, for example, 50 to 100 nm in size, a layer prepared by the preferred method of the present invention shows clearly better aging properties. E.g. Ag layers of nanometer thickness prepared according to methods known in the prior art are hardly resistant against aging and the initially good conductivity decreases quickly. This does not happen to the coatings of the present invention. Obviously, the surface and the deposition are favourably influenced by the organic nanometal (the conductive polymer).

The dispersions according to the invention as herein defined can also be used to protect copper powders against oxidation, wherein the copper powder particles have a size in the micrometer range or submicrometer range, i.e. smaller than 1 μm.

Below, the invention is further illustrated by means of the figures and by non-limiting examples.

Figure 3A:
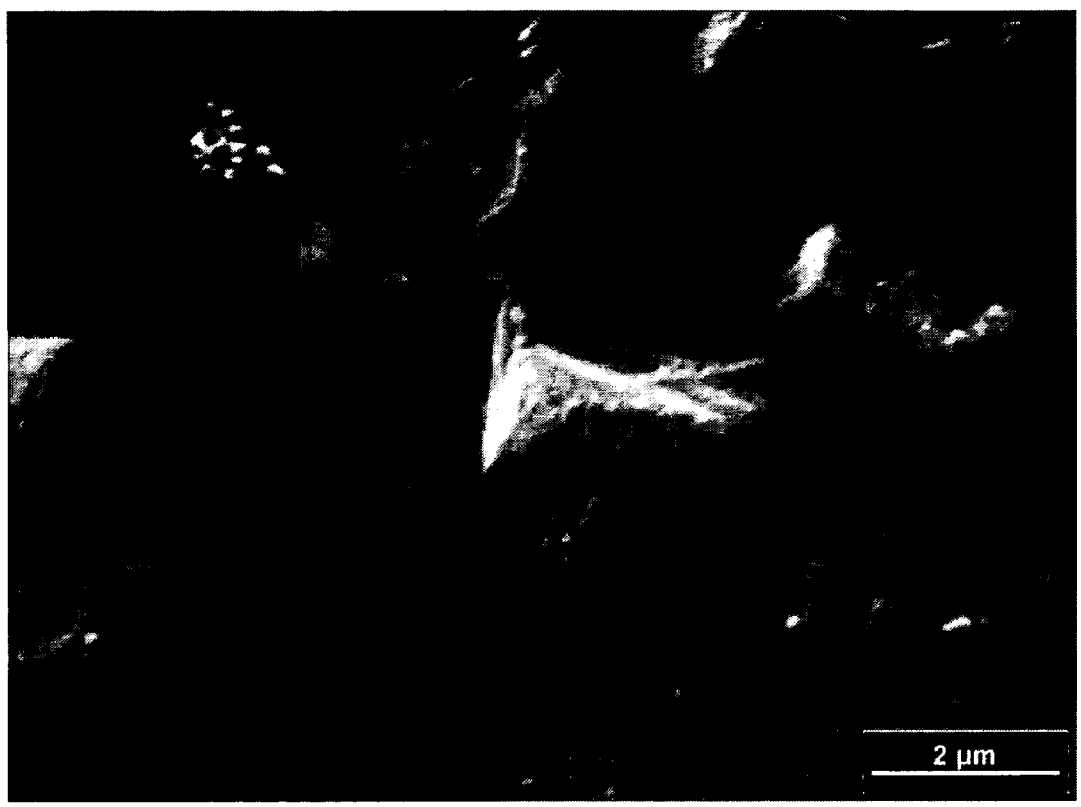

FIG. 3*a* shows an SEM image of a layer with a more homogeneous morphology.

Figure 3B:

FIG. 3*b* shows an SEM image of a layer obtained according to the second aspect of the invention.

Figure 3C:
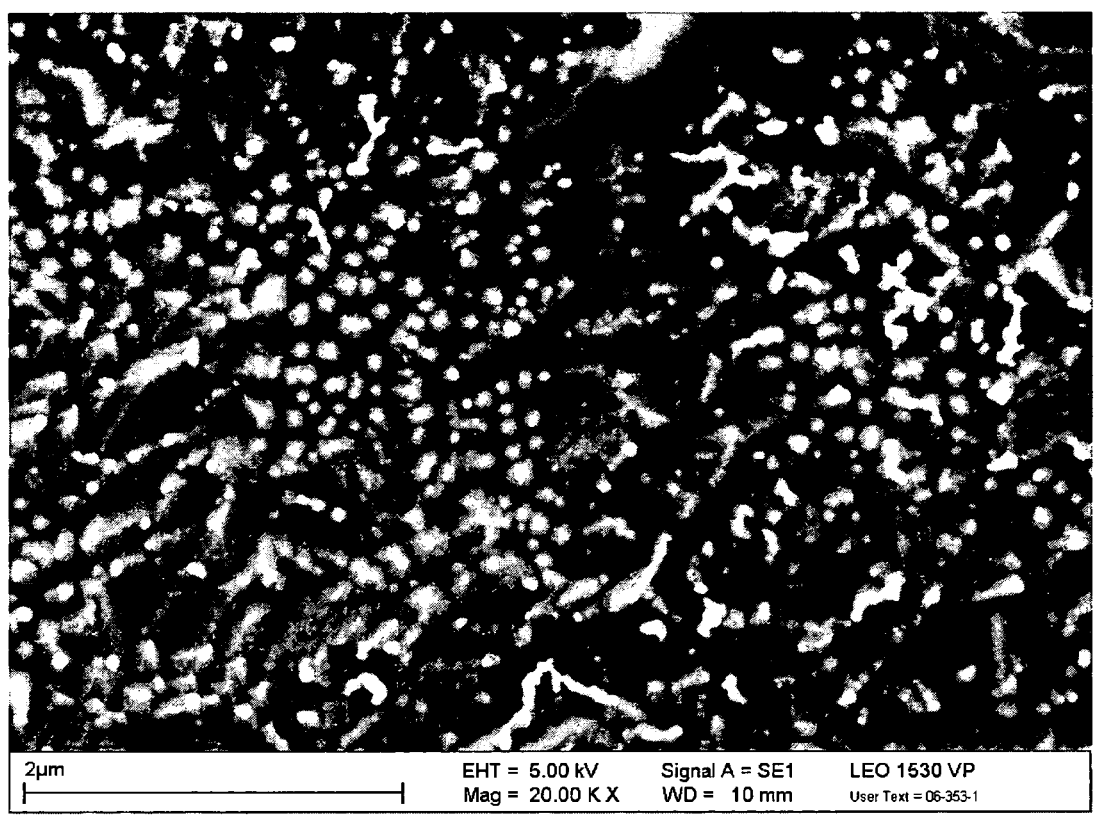

FIG. 3*c* shows an SEM image of a layer with a more particulate morphology.

Figure 4:

FIG. 4 shows a layer prepared according to the second aspect of the present invention which does not show any microvoids.

Figure 5:
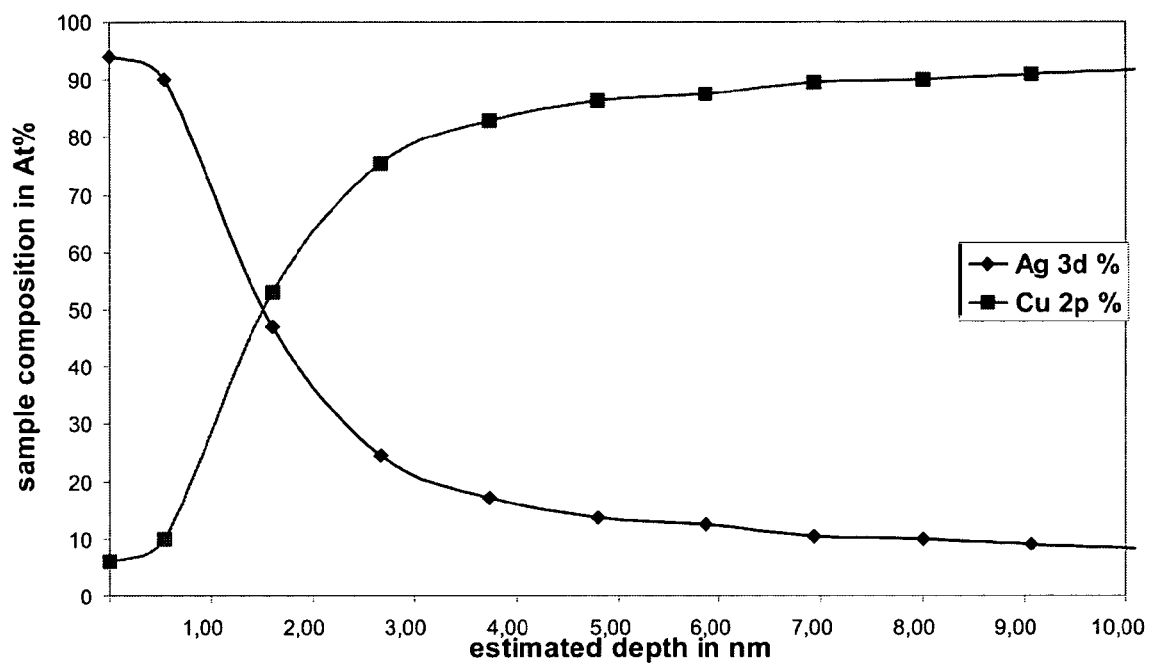

FIG. 5 shows an XPS depth profile of the freshly prepared surface of a coating according to the present invention.

Figure 6:
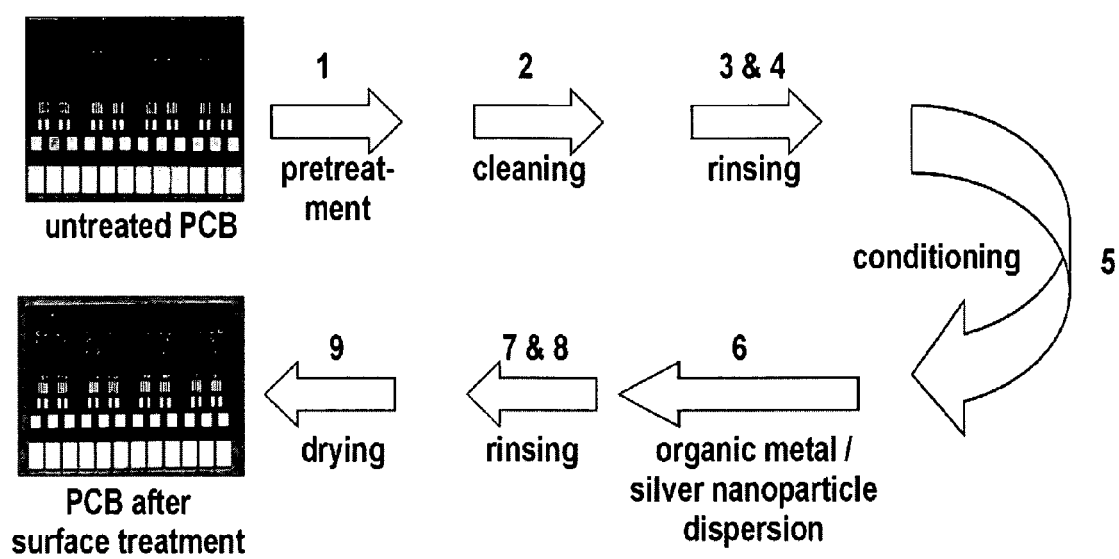

FIG. 6 shows a scheme of process for providing a solderable surface coating (surface finish) for printed circuit boards (PCBs).

Figure 7A:
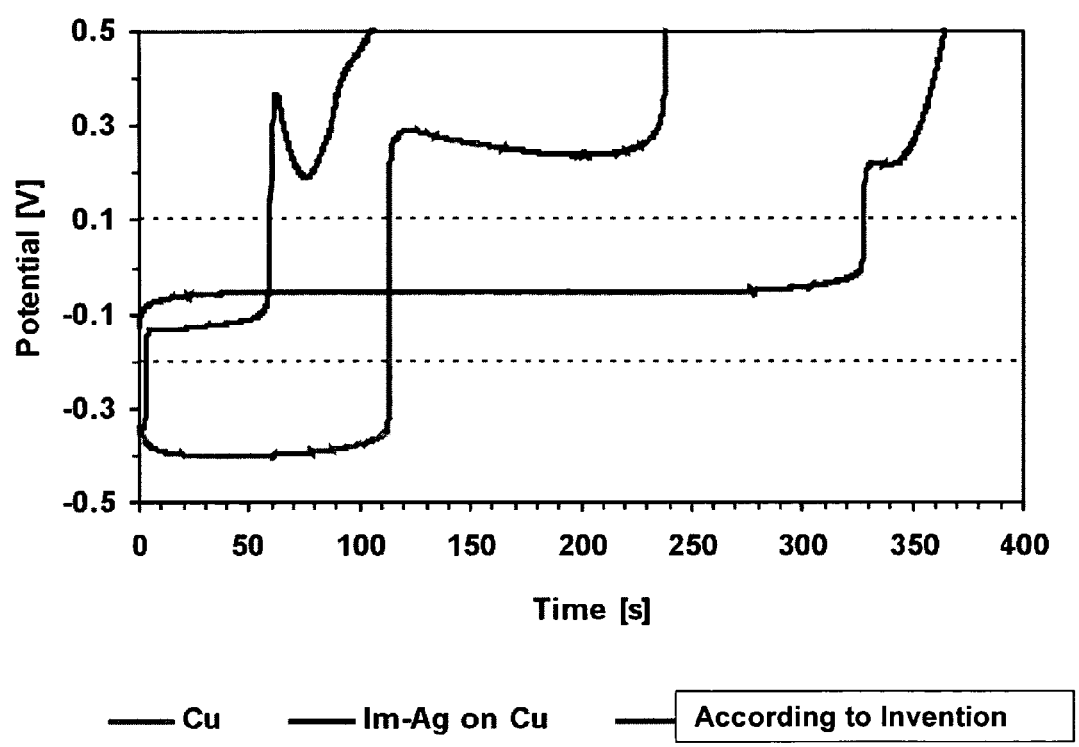

FIG. 7*a* shows potential-time-curves for Cu (middle curve), Ag coated on Cu by immersion (curve on the right) and for a nanolayer according to the present invention coated on Cu by immersion (curve on the left) determined in a galvanostatic coulometric measurement.

Figure 7B:
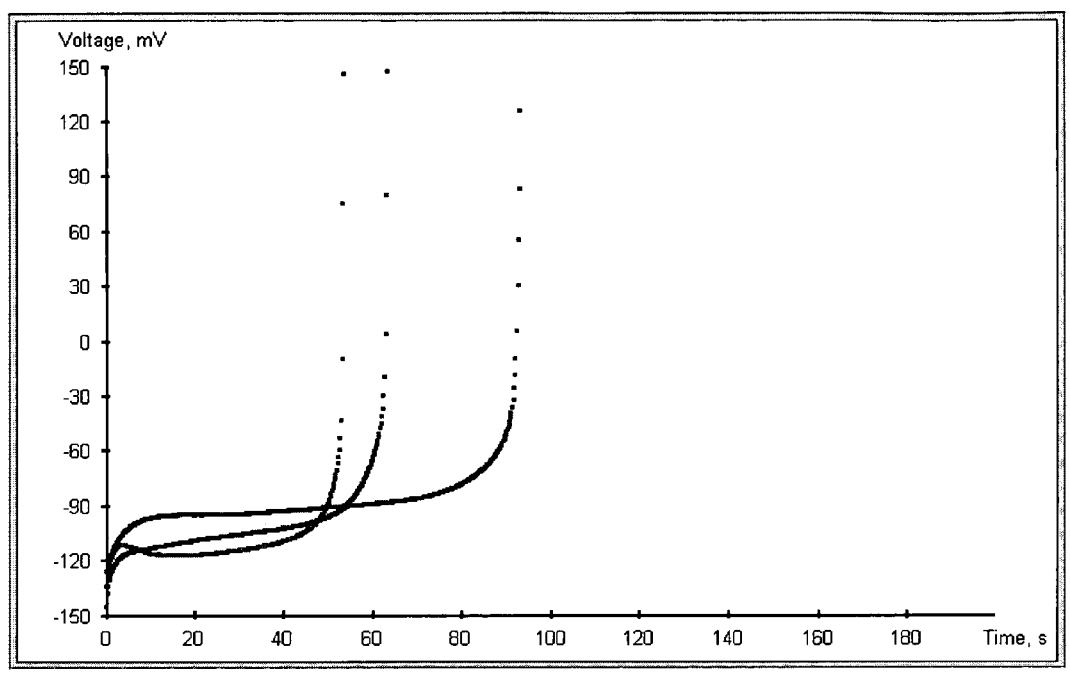

FIG. 7*b* shows a comparison by a galvanostatic coulometric measurement between layers according to the first and to the second aspect of the invention (curve on the left: first aspect, curve in the middle and on the right: second aspect, with 225 and 450 mg/l Ag, resp.)

Figure 8:
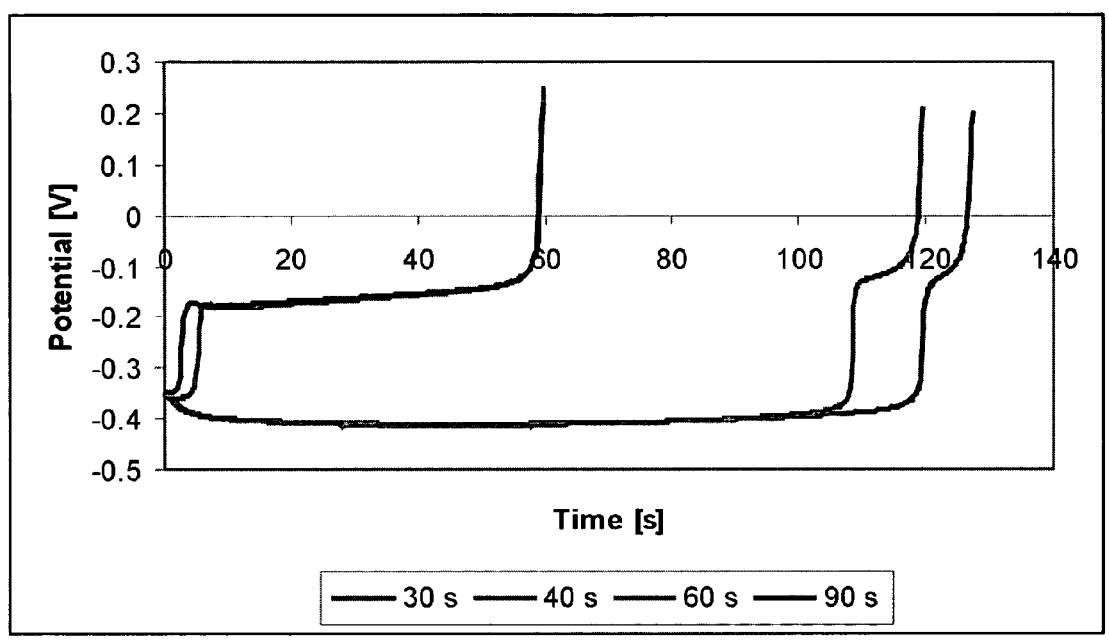

FIG. 8 shows potential-time curves for a copper surface being coated according to the present invention for different immersion times.

Figure 9:
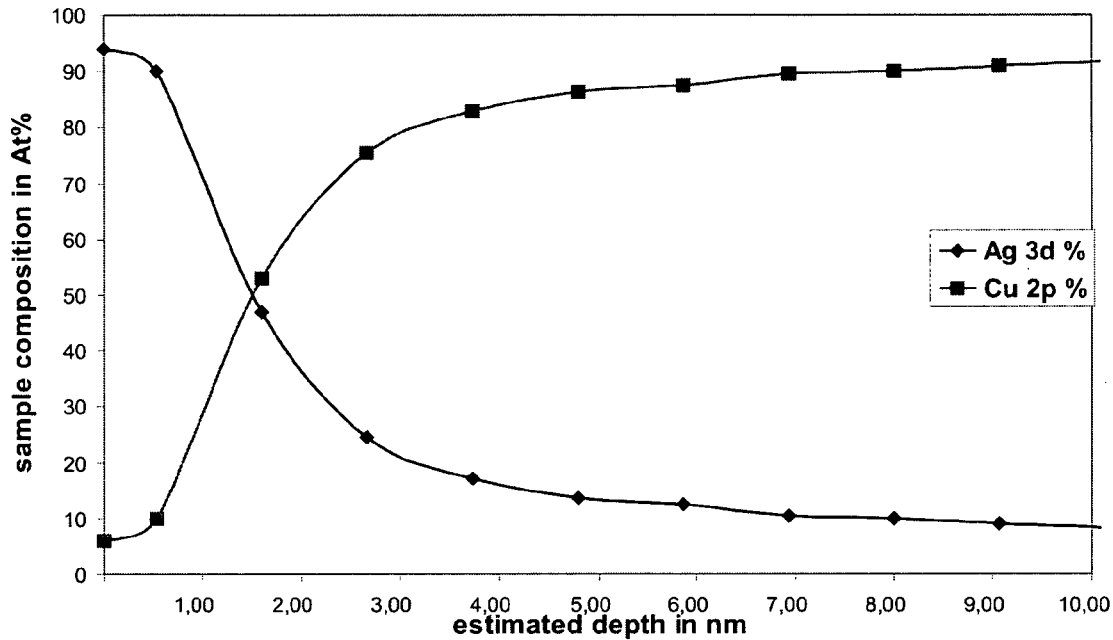
Figure 9:
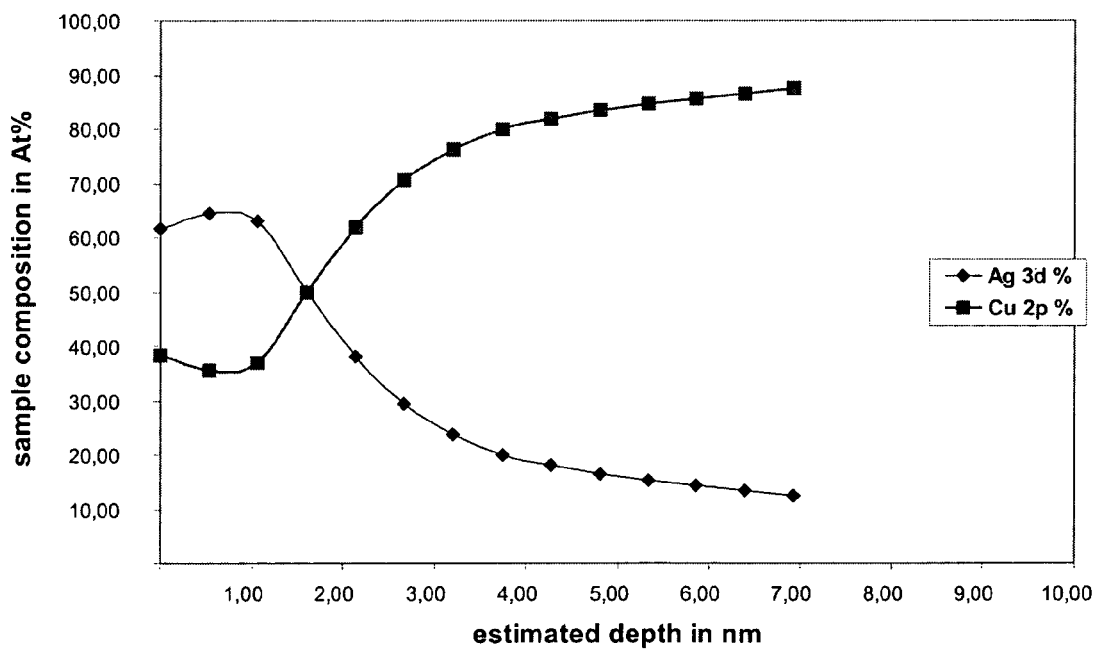

FIG. 9 shows a comparison of depth profiles of copper and silver on the treated copper surfaces before and after one reflow step. At the surface, the silver to copper ratio changes during the reflow process (the ratio becomes smaller), but from a depth of about 2 nm on no change in the ratio can be detected after the reflow process.

Figure 10:
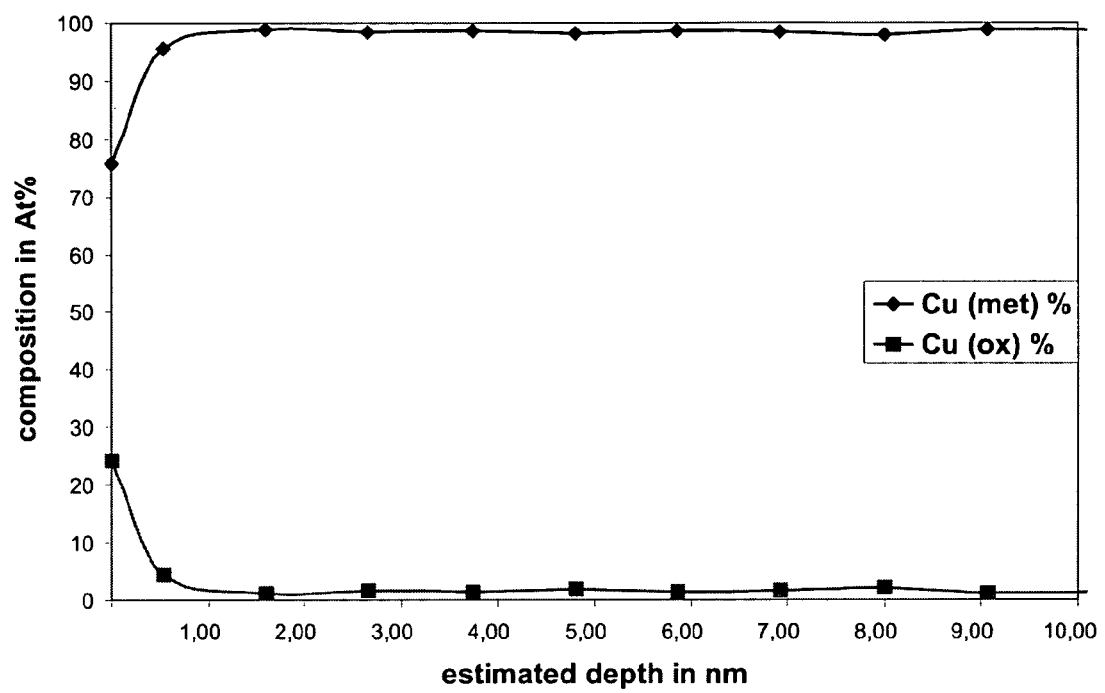

FIG. 10 shows the ratio of metallic to oxidized copper in the fresh sample (surface).

Figure 11:
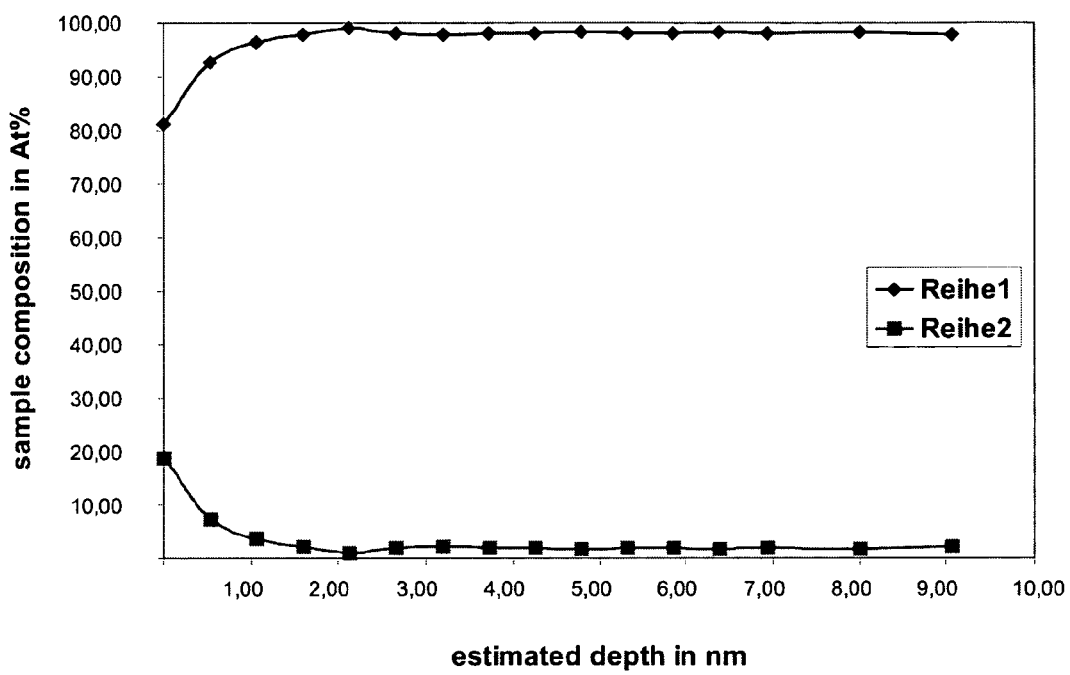

FIG. 11 shows the ratio of metallic to oxidized copper after one reflow step.

Figure 12:
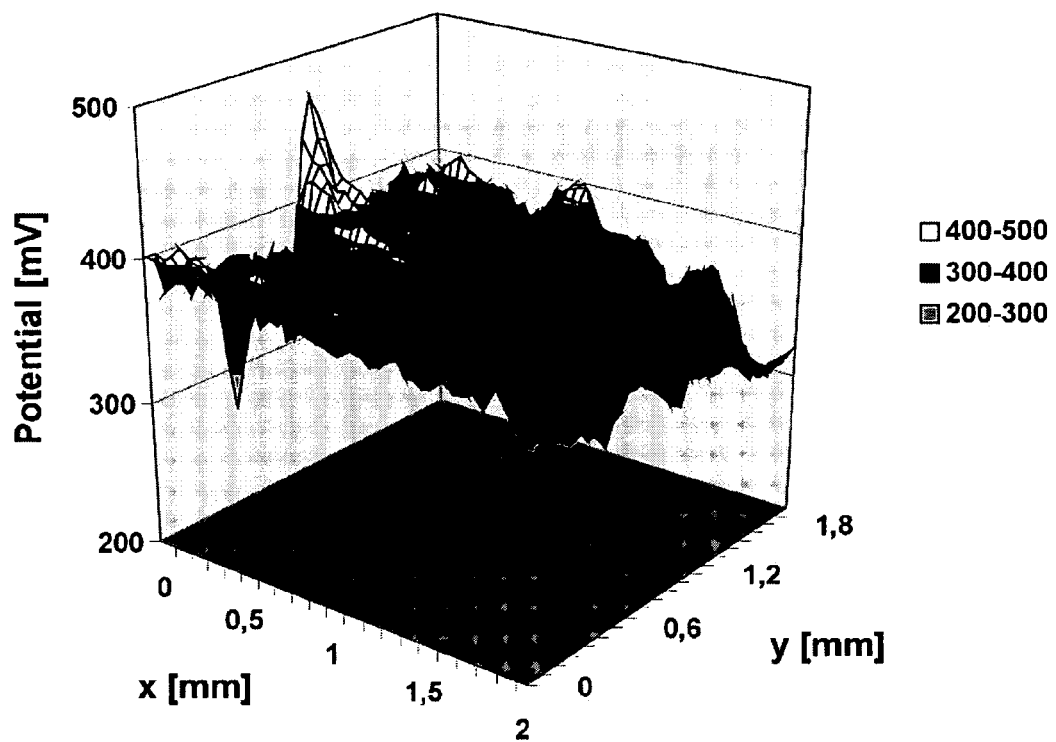

FIG. 12 shows the surface potential of a copper surface treated with organic metal/silver nanoparticle finish in the fresh stage after finishing.

Figure 13:
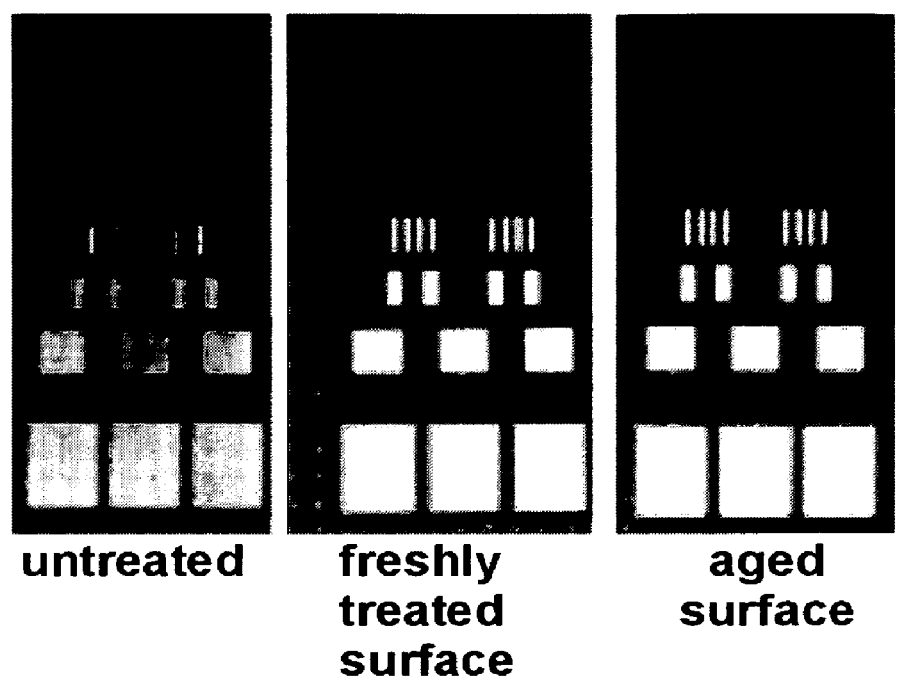

FIG. 13 shows PCB before surface finish, after surface finish and after surface finish and aging.

EXAMPLES

Example 1

Figure 1:
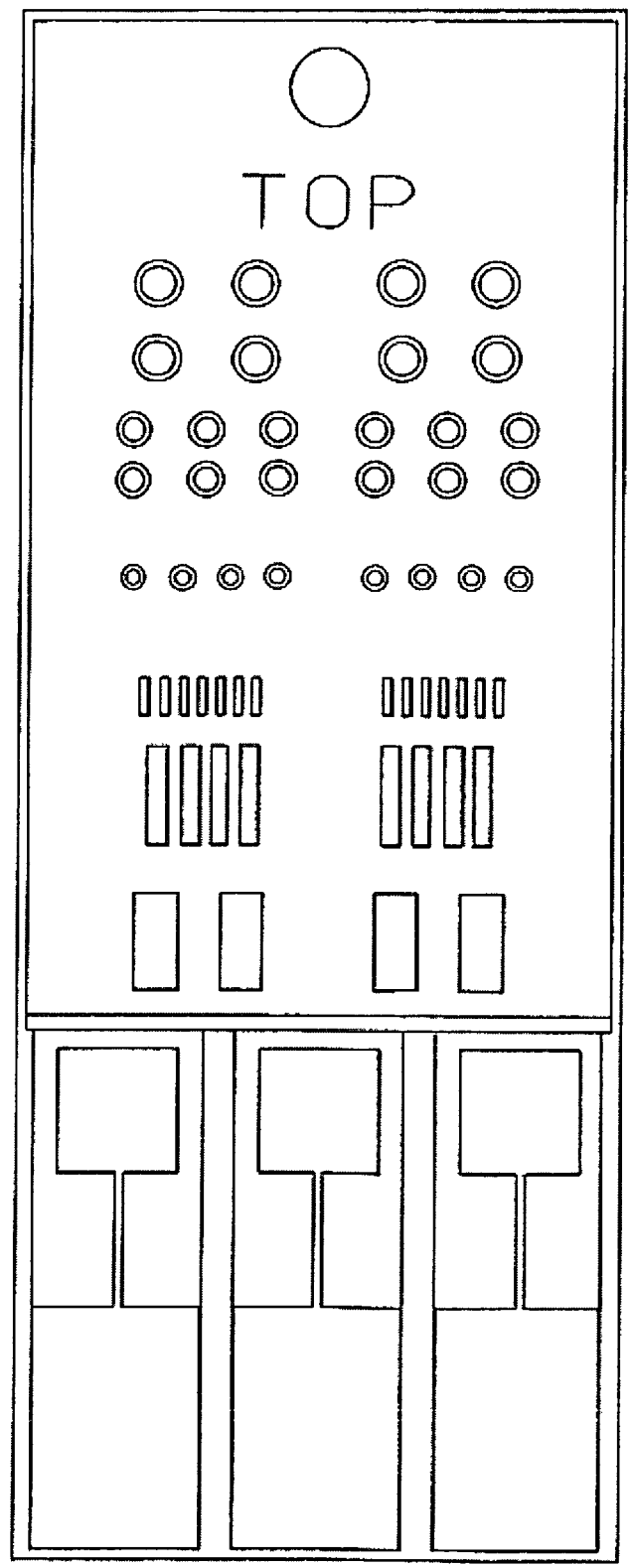
FIG. 1 shows a printed circuit board with a test design.

Production of Coated Printed Circuit Board According to the First Aspect of the Invention Epoxy resin composite printed circuit boards were cleaned and degreased using a normal commercial cleaner based on sulphuric acid and citric acid (ACL 7001, Ormecon GmbH) in a cleaning bath for 2 minutes at 45° C. The printed circuit boards used had a test design (see FIG. 1), which has been agreed with test institutes and printed circuit board manufacturers and is modelled on real printed circuit board structures. These boards enable the solderability to be measured and assessed. Next, the printed circuit boards were rinsed with tap-water at room temperature and then treated with an $H_2O_2$-containing etching solution (Etch 7000, Ormecon GmbH) for 2 minutes at 30° C. After etching, the boards were again rinsed with tap-water at room temperature and then coated with $AgNO_3$ with a dispersion according to the invention in the form of OMN 7100. For this purpose, the boards were immersed in the aqueous dispersion at room temperature for 1 minute. After this, the printed circuit boards were dried at 45 to 75° C.

Example 2

Production of Coated Printed Circuit Boards with OMN 7100

Printed circuit boards were coated analogously to Example 1, but wherein the dispersion OMN 7100 used contained no $AgNO_3$.

Examples 3 and 4

Production of Coated Printed Circuit Boards (Comparison)

Analogously to Examples 1 to 2, printed circuit boards were coated with normal commercial agents based on benzotriazole in accordance with the respective use instructions (Glicoat Tough Ace F2 (LX); Shikoku Co., Japan, Example 3 and Entek Plus Cu 106 A, Enthone OMI, Netherlands, Example 4).

The appearance of the produced samples is given in Table 1.

TABLE 1

| | Appearance of the coatings | |
|---|---|---|
| Example | Active ingredient in dispersion | Appearance of the treated boards |
| 1 | OMN 7100 with AgNO3 | silvery with a copper colour showing through |
| 2 | comparative test OMN 7100 | freshly copper-coloured |

TABLE 1-continued

Appearance of the coatings

| Example | Active ingredient in dispersion | Appearance of the treated boards |
|---|---|---|
| 3 | comparative test OSP 1 | freshly copper-coloured |
| 4 | comparative test OSP 2 | freshly copper-coloured |

Example 5

Soldering Angle Measurement

Figure 2:
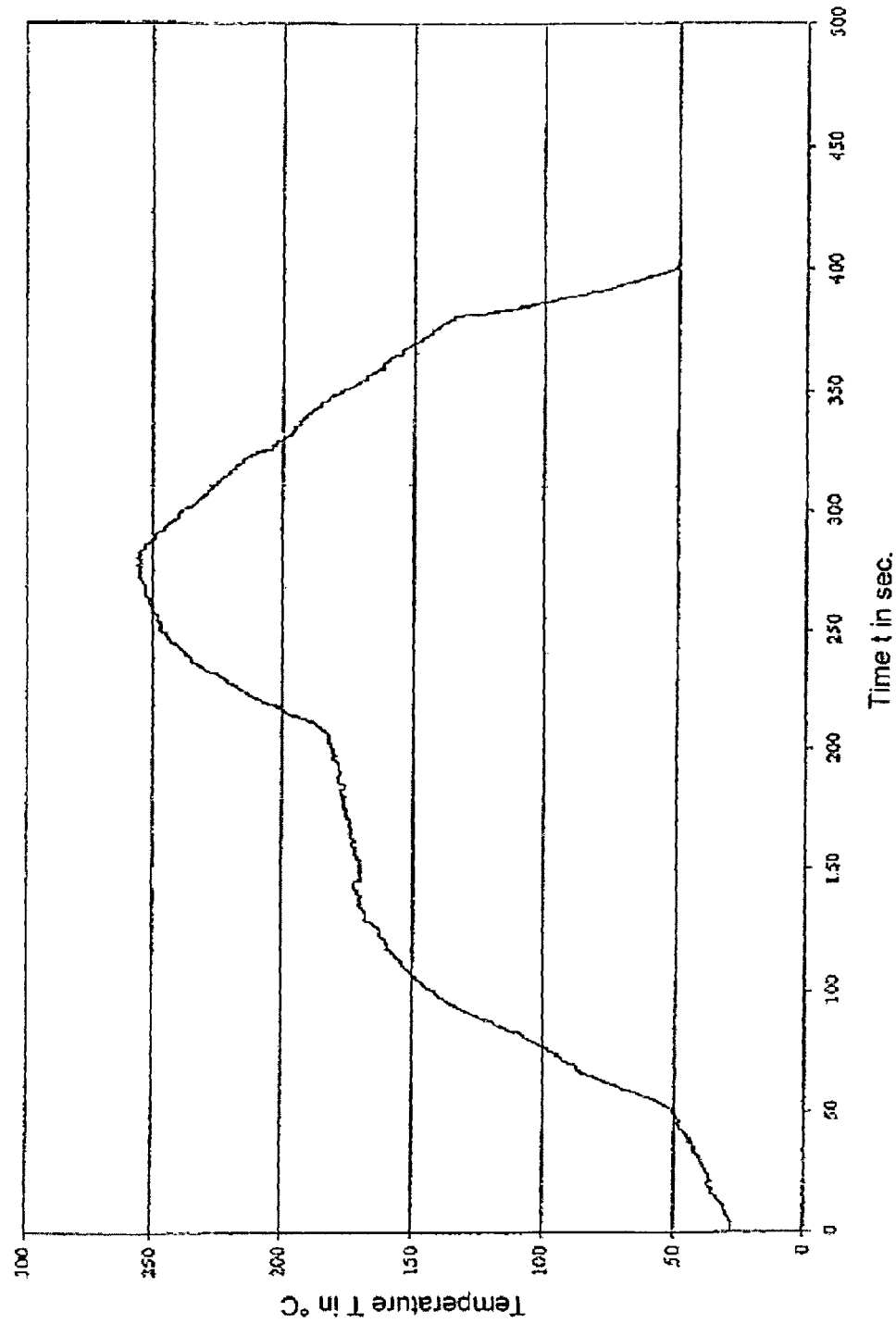
FIG. 2 shows the heat profile used in a reflow test.

The boards were subjected to a reflow test. The board was subjected in a commercial reflow oven to a heat profile (as shown in FIG. 2) which was used for modern lead-free soldering methods. The reflow cycles served for the simulation of repeated soldering operations. The soldering angle was then measured by means of a soldering balance.

The results of the soldering angle measurements are shown in Table 2.

TABLE 2

Results of the soldering angle measurement

| Test | Reflow cycles | Appearance | Soldering angle (°) |
|---|---|---|---|
| 1 | 0 | silvery-copper coloured | 12 |
|   | 1 | slightly darkened silvery-copper coloured | 28 |
|   | 2 | little further change | 28 |
|   | 3 | little further change | 33 |
| 2 | 0 | freshly copper-coloured | 21 |
|   | 1 | orange | 28 |
|   | 2 | dark orange | 35 |
|   | 3 | bluish-silver | 45 |
| 3 | 0 | freshly copper-coloured | 24 |
|   | 1 | iridescent bright purple | 45 |
|   | 2 | more marked discoloration | 68 |
|   | 3 | marked oxidative discoloration (iridescent purple) | 99 |
| 4 | 0 | freshly copper-coloured | 21 |
|   | 1 | iridescent bright purple | 42 |
|   | 2 | more marked discoloration | 51 |
|   | 3 | marked oxidative discoloration (iridescent purple) | 84 |

It can be seen that the coating according to the invention has small soldering angles even after repeated reflow cycles. This indicates better solderability.

Example 6

Production of Coated Printed Circuit Board According to the Second Aspect of the Invention Epoxy resin composite printed circuit boards were cleaned and degreased as described in Example 1. The printed circuit boards used had a test design and were rinsed with tap-water at room temperature and then treated with an $H_2O_2$-containing etching solution as described in Example 1. After etching, the boards were again rinsed with tap-water at room temperature and then coated with a dispersion according to the invention in the form of OMN 7100 containing $AgNO_3$ in a concentration of 200 mg/l. For this purpose, the boards were immersed in the aqueous dispersion at a temperature of 35° C. for 90 s. After this, the printed circuit boards were dried at temperatures of up to 100° C.

Example 7

Production of Coated Printed Circuit Boards with OMN 7100

Printed circuit boards were coated analogously to Example 1, but wherein the dispersion OMN 7100 used contained no $AgNO_3$.

Example 8

Production of Coated Printed Circuit Boards (Comparison)

Analogously to Example 7, printed circuit boards were coated with normal commercial agents based on benzotriazole in accordance with the respective use instructions (Shikoku Co., Japan).

Example 9

Soldering Angle Measurement

The boards were subjected to a reflow test as described in Example 5. The results of the soldering angle measurements are shown in Table 3.

TABLE 3

| Experiment | Reflow-steps | Soldering Angle WA(°) | WA after 85° C./85% rel moisture 16 hr | WA after aging at 155° C./4 h |
|---|---|---|---|---|
| Example 7 | 0 | 15-20 | 70 | 25-30 |
|  | 1 | 20-25 | 70 | 25-30 |
|  | 2 | 25-30 |  | 25-30 |
|  | 3 | 20-30 |  | 30-35 |
|  | 4 | 30-35 |  | 30-40 |
|  | 5-10 | 30-40 |  |  |
| Example 8 (Comparison) „OM Nanofinish") | 0 | 20-30 |  | 45-60 |
|  | 1 | 30-50 |  | 70-80 |
|  | 2 | 35-70 |  | 65-80 |
|  | 3 | 65-70 |  | 110-130 |
|  | 4 | 75-85 |  | — |
| For Comparison ORMECON CSN | 0 | 15 | 80 | 20 |
|  | 1 | 25 | >90 | 30 |
|  | 2 | 30 |  | 35 |
|  | 3 | 45 |  | 50 |
|  | 4 | 60 |  | 70 |
| Example 9: (Comparison) Conventional OSP | 0 | 25-30 |  | >90 |
|  | 1 | 40-50 |  | >90 |
|  | 2 | 65-70 |  | >90 |
|  | 3 | >90 |  | >90 |
|  | 4 |  |  | >90 |

Example 10

10.1 Synthesis and Dispersion of Polyaniline

Polyaniline powder was synthesized by oxidative polymerization of aniline in the presence of p-toluene sulfonic acid as dopant as described in WO-A-89/02155. The resulting green polymer powder had a conductivity of 5 S/cm measured as a pressed pellet (10 t pressure at room temperature for 5 minutes).

The subsequent dispersion of the polyaniline was performed according to the process described in PCT/EP2005/000595.

10.2 Preparation of Organic Metal/Silver Dispersion

First, a polyaniline dispersion in water was created following reference. The dispersion had a particle size of 55 nm (measured by Laser Doppler technique) and showed a conductivity of 180 S/cm when deposited as a homogeneous layer on a glass substrate. Dispersing and surface active agents to improve soldering and AgNO3 (150 mg/l) were added to the dispersion. After thorough mixing the dispersion is ready to use.

10.3 Providing a Solderable Surface Coating (Finish) for PCBs

The process of providing a solderable surface finish for PCBs using the organic metal/silver nanoparticle finish (as shown in FIG. 6) is a procedure starting with an acid cleaning, followed by a microetch pretreatment step and then by the deposition of the active organic metal/silver layer, ending with rinsing and drying of the PCB. The OM/Ag dispersion deposition was carried out at 35° C. for 90 sec.

In the first step the PCB is pretreated by a dispersion containing polyaniline (1). In the following step the board is cleaned using an acidic solution (2), followed by two rinsing steps (3 & 4) in water. An acidic solution is used as a conditioner (5). In the most important step the organic metal/silver nanolayer is deposited on the PCB using the aqueous dispersion of polyaniline containing a silver salt (6). After that the PCB is rinsed twice in water (7 & 8) and dried (9).

10.4 Electrochemical Thickness Determination

With a galvanostatic coulometric measurement (GCM) a metallic coating is removed from its metallic or non-metallic substrate by using an electrolyte and applying an electric current (according to DIN EN ISO 2177 and ASTM B504). The current is controlled (frequently held constant) and the potential becomes the dependant variable, which is determined as a function of time.

The constant current i applied to the electrode causes the metallic coating $Me_A$ to be oxidized at a constant rate to the product $Me_A^{n+}$ (n=number of electrons reduced). The potential of the electrode moves to values characteristic of the couple $Me_A/Me_A^{n+}$. After the complete oxidation of the coating $Me_A$ the potential at the electrode will rapidly change towards more positive values until a second oxidation process can start at the new interface $Me_B$ (intermetallic phase or second metal).

The relationship of the oxidized mass is quantitative according to Faradays law (1):

$$m = i \times t \times M / n \times F \quad (1)$$

with i=applied constant current t=transition time

M=molecular weight n=number of electrons

F=Faraday constant

Equation (1) does not hold if secondary reactions occur and the current is not exclusively used for oxidation of $Me_A$ or the reduction of oxides.

The electrochemical cell consisted of a working electrode with a 0.25 cm² area, designed specifically for the evaluation of layer thickness, a platinum wire counter electrode and a reference electrode (Ag/AgCl in 3 mol KCl). The test electrolyte was filled into a 50 ml glass body with three 14.5/23 standard tapers and the electrodes are mounted with taper joints. The electrolyte used was a water based solution of potassium thiocyanate. The electrolyte was not deaerated.

As shown in FIG. 7, at the indicated potential regions the following reactions occurred:

The finish of the copper surface in dependence on the immersion time in organic metal/silver nanoparticle finish is displayed in FIG. 8. The potentials indicate that the amount of free copper surface decreases slowly at the beginning of the process, having the highest rate between 40 and 60 s immersion time and after 60 s the rest of the free copper surface is coated slowly. After about 90 s there is no free copper detectable.

10.5 Morphology Investigation by SEM

FIG. 3 shows a scanning electron microscopy (SEM) image of copper pad of a PCB after treatment with the organic metal/silver nanoparticle finish. The measurements were done using a field emission SEM from LEO, type 1530VP with appropriate test panels on which the Pani-Ag complex had been deposited under standard conditions. The microscope was calibrated regularly using a standard certified by the PTB (Physikalisch Technische Bundesanstalt in Braunschweig, Germany) Standard No.5282-PTB-04).

10.6 XPS Investigations

The x-ray photoelectron spectroscopy (XPS) measurements were done using an ESCALAB 250 from Thermo VG Scientific with appropriate test panels on which the Pani-Ag complex had been deposited under standard conditions. The information depth is about 5-10 nm, the detection limit differs from element to element but is around 0.1 At %. Monochromatic Al Kα x-rays were used (15 kV, 150 W) and the spectra were measured using a pass energy of 80 eV for survey spectra and 30 eV for core level spectra. If necessary charge compensation was done using a Flood Gun (e– energy ~6 eV/0.05 mA current)

Quantitative information about the surface composition was calculated from survey spectra using the standard Scofield sensitivity factors (J. H. Scofield, Journal of Electron Spectroscopy and Related Phenomena 8, 129, (1976)). The error can be estimated to be typically ~10%; statistic errors of single measurements were calculated using the method of Harrison and Hazell (SIA, 18, 1992, p. 368-376).

The ratio of metallic to oxidized copper on the surface of the fresh sample and the sample after reflow are shown in FIGS. 11 and 12. This ratio did not change in the reflow process.

10.7 Kelvin Potential

The surface potentials of copper, oxidized copper, silver on copper after immersion and organic metal/silver nanoparticle finish on copper after immersion were determined using a scanning kelvin probe (SKP, UBM Messtechnik GmbH, Ettlingen, Germany). The volta-potential measured with a kelvin sensor is suitable for non-contact measurements of surface potentials (M. Stratmann, H. Streckel and R. Feser, Corros. Sci. 32, 467 (1991)). The measured object, the working electrode, and the reference electrode of the Kelvin probe form, due to the small gap between them, a capacitor. The amplitude of the potential developed between them shows the degree of surface activity. A periodic variation in separation by means of an actuator built into the sensor changes the capacitance of the set-up. The resulting signal is converted to a measurement signal by means of a lock-in amplifier (Information brochure of UBM Messtechnik GmbH, Ettlingen (1996)). The volta-potential difference is directly determined by the surface potential (M. Stratmann, M. Wolpers, H. Streckel and R. Feser, Ber. Bunsenges. Phys. Chem. 95, 1365 (1991)).

As vibrating reference electrode a tungsten wire with a tip diameter of 80 μm was used. The tip was positioned about 25 μm above the specimen, the vibration amplitude was ±10 μm and the vibration frequency of the needle was 1.75 kHz. As the measurements were performed in laboratory atmosphere, gold was used as reliable reference material.

The Kelvin potentials of different treated and untreated copper surfaces are summarized in Table 4.

TABLE 4

Kelvin potentials of different surfaces

| Surface | Kelvin potential [mV] |
|---|---|
| Cu (pure, unoxidized) | 70 |
| Cu oxides | 150-180 |
| Cu treated with organic metal/ silver nanoparticle finish (50 nm layer) | 320-340 |
| Cu treated with immersion silver (500 nm layer) | 400 |

10.8 Thermal Ageing and Solderability Determination

The thermal aging was performed to simulate soldering and storage conditions. To simulate soldering conditions test panels on which the PAni-Ag complex had been deposited under standard conditions were aged up to 4 times in the reflow oven RO 300 FC N2 from Essemtec, Swizerland. A lead free soldering profile was chosen with a peak temperature ~250° C. To simulate storage conditions other test panels were aged 4 h at 155° C. in the IR hot air oven Techno HA-06 from Athelec.

The solderability measurements were preformed using the wetting balance Meniscograph ST60 from Metronelec with appropriate test panels on which the Pani-Ag complex had been deposited under standard conditions. The solderability of the panels was determined as wetting angle under lead free soldering conditions. The solder $Sn_{95.5}Ag_{3.8}Cu_{0.7}$ (260° C.) from Ecoloy and fluxer 959 T from Kester were used. The measurement data was converted to wetting angle using the software from Metronelec according to the standard NF-A-89 400P.

The performance of copper surfaces treated with organic metal/silver nanoparticle finish and established metallic surface finishes is compared before and after reflow in Table 5.

TABLE 5

Wetting angles before and after reflow process for different surfaces

| Process | Reflow cycles | Wetting angle [°] | Wetting angle after ageing at 155° C. for 4 h [°] |
|---|---|---|---|
| established metallic surface finishes | 0 | 15 | 20 |
| | 1 | 25 | 30 |
| | 2 | 30 | 35 |
| | 3 | 45 | 50 |
| | 4 | 60 | 70 |
| Organic metal/ silver nanoparticle finish | 0 | 15-20 | 25-30 |
| | 1 | 20-25 | 25-30 |
| | 2 | 25-30 | 25-30 |
| | 3 | 20-30 | 30-35 |
| | 4 | 30-35 | 30-40 |

Thus, surprisingly and in contrast to the formerly developed dispersion "OMN 7100" (which forms a coherent thin layer on the Cu surface), the same dispersion only containing a minor amount of Ag is forming a nanoparticulate discontinuous layer. The particles were around 100 nm small and exclusively located on the phase boundaries of the Cu crystallites.

Assuming a density of 1.3 g/cm$^3$ (as in polyaniline) and a transfer of 2 electrons per 4 aniline monomer units, the electrochemical measurements lead to a nominal average thickness of the Polyaniline-Ag layer of around 50 nm. XPS measurements showed that the Silver within these 50 nm only has a nominal average thickness of about 4 nm.

The electrochemical investigation (FIG. 7) showed that a new form of complex has formed. The potential at which this complex is oxidized is significantly different from Ag on Cu and also from polyaniline alone.

This is also confirmed by the Kelvin probe measurements which show the surface potential (FIG. 13 and Table 5).

The XPS showed a very small amount of the Cu surface atoms to be in oxidized stage even after thermal ageing under ambient atmosphere (FIGS. 11 and 12), only around 20-25%, and ageing does not change the degree of oxidation. Also, during ageing, the Ag did not migrate into the Cu (FIGS. 9 and 10).

For the practical industrial application in PCB assembly, this surface finish seems to be exceptional. It does not show any discoloration during reflow, and the wetting behaviour (according to wetting balance studies) is superior to any metallic surface finish (Table 5). Tests in PCB manufacturing and in assembly facilities have confirmed this. FIG. 14 shows a printed circuit board before treatment, directly after the surface coating (i.e. surface finish) with organic metal/silver nanoparticle finish and the surface after treatment and aging.

The invention claimed is:

1. Coated article, which comprises
   (i) at least one electrically non-conducting base layer,
   (ii) at least one layer of copper and/or a copper alloy, and
   (iii) a layer which consists of at least one electrically conductive polymer and at least one precious metal selected from the group consisting of Ag, Au, Pd, Pt, Rh, Ir, Ru, Os and Re or at least one semiprecious metal selected from the group consisting of Ni, Ti, Cu and Bi, or a mixture thereof, and, optionally, further components selected from electrically non-conducting components and complexing agents,
   wherein the copper or copper alloy layer (ii) is positioned between the base layer (i) and layer (iii) containing the conductive polymer.

2. Coated article according to claim 1, in which the precious metal is selected from the group consisting of Ag and Au, and is in particular Ag.

3. Coated article according to claim 1, in which the semiprecious metal is selected from the group consisting of Ni and Ti.

4. Coated article according to claim 1, in which layer (iii) has a layer thickness of 10 nm to 1 μm.

5. Coated article according to claim 4, in which layer (iii) has a layer thickness of less than 500 nm.

6. Coated article according to claim 4, in which layer (iii) has a layer thickness of less than 200 nm.

7. Coated article according to claim 1, in which layer (iii) contains 5% to 45% of the conductive polymer and 5 to 45% of (semi)precious metal, relative to the mass of layer (iii) and further components selected from electrically non-conducting components and complexing agents.

8. Coated article according to claim 1, wherein layer (iii) is a nanoscopic layer having an average thickness of 100 nm or less, which layer contains at least 80 weight-%, relative to layer (iii), of the at least one precious metal and/or semiprecious metal other than copper and further components selected from electrically non-conducting components and complexing agents.

9. Coated article according to claim 8, wherein layer (iii) has an average thickness of 2 to 100 nm.

10. Coated article according to claim 8, wherein layer (iii) has an average thickness of less than 10 nm.

11. Coated article according to claim 1, in which layer (iii) contains also at least one electrically non-conducting component.

12. Coated article according to claim 11, in which the electrically non-conducting component is a polymer.

13. Coated article according to claim 1, in which layer (iii) contains at least one complexing agent.

14. Coated article according to claim 13, in which the complexing agent is a copper complexing agent.

15. Coated article according to claim 13, in which the complexing agent is selected from benzimidazoles, imidazoles, benzotriazoles, urea, thiourea, imidazole-2-thiones, (sodium) ethylenediamine tetraacetate (EDTA), (K-, Na-) tartrates, ethylenediamine-disuccinic acid, and mixtures thereof.

16. Coated article according to claim 1, in which the electrically conducting polymer is selected from polyaniline (PAni), polythiophene (PTh), polypyrrole (PPy), poly(3,4-ethylenedioxythiophene) (PEDT), polythieno-thiophene (PTT), derivatives thereof and mixtures thereof.

17. Coated article according to claim 1, in which the base layer (i) contains epoxide, epoxide composite, Teflon, cyanate ester, ceramic, cellulose, cellulose composite, cardboard and/or polyimide.

18. Coated article according to claim 1, in which the base layer (i) has a layer thickness of 0.1 to 3 mm.

19. Coated article according to claim 1, in which layer (ii) has a layer thickness of 5 to 210 μm.

20. Coated article according to claim 1, which contains a further metal or alloy layer (iv), which is positioned between layer (ii) and layer (iii).

21. Coated article according to claim 20, in which layer (iv) contains silver, tin, gold, palladium or platinum.

22. Coated article according to claim 20, in which layer (iv) has a layer thickness of 10 to 800 nm.

23. Coated article according to claim 1 in the form of a printed circuit board.

* * * * *